United States Patent [19]
Pezzani

[11] Patent Number: 5,883,500
[45] Date of Patent: Mar. 16, 1999

[54] THREE-STATE MONOLITHIC STATIC SWITCH

[75] Inventor: Robert Pezzani, Vouvray, France

[73] Assignee: SGS-Thomson Microelectronics S.A., Saint Genis, France

[21] Appl. No.: 805,823

[22] Filed: Feb. 26, 1997

[30] Foreign Application Priority Data

Feb. 29, 1996 [FR] France .................................. 96 02781

[51] Int. Cl.[6] ................................................ G05F 1/00
[52] U.S. Cl. ..................... 323/217; 318/280; 327/438
[58] Field of Search ................................ 323/217, 229; 318/280; 307/140; 327/438, 447, 464, 521

[56] References Cited

U.S. PATENT DOCUMENTS

| | | | |
|---|---|---|---|
| 3,959,668 | 5/1976 | Ohhinata et al. | 307/252 |
| 4,049,976 | 9/1977 | Pascente | 307/252 |
| 4,239,985 | 12/1980 | Ohhinata | 327/450 |
| 4,370,567 | 1/1983 | Lear | 307/252 |
| 4,412,160 | 10/1983 | Kojima et al. | 318/280 |
| 4,896,084 | 1/1990 | Maue et al. | 318/280 |
| 5,160,875 | 11/1992 | Kono | 318/280 |
| 5,467,049 | 11/1995 | Kida et al. | 327/438 |

OTHER PUBLICATIONS

French Search Report from French Patent Application No. 96 02781, filed Feb. 29, 1996.

Primary Examiner—Stuart N. Hecker
Attorney, Agent, or Firm—Wolf, Greenfield & Sacks, P.C.

[57] ABSTRACT

A three-state switch designed to be inserted in an ac supply circuit and associated with a state selection circuit. In a first state, the switch is open and does not allow current to flow. In a second state, the switch allows current of a first polarity to flow. In a third state, the switch allows a current of a second polarity to flow. The switch includes a cathode gate thyristor and an anode gate thyristor connected head-to-tail, the gate of the cathode gate thyristor forming a control terminal and being connected through a resistor to the gate of the anode gate thyristor.

20 Claims, 2 Drawing Sheets

THREE-STATE MONOLITHIC STATIC SWITCH

BACKGROUND OF THE INVENTION

1. Field of the Invention

The present invention relates to a three-state switch designed to turn on or off a current of a selected direction in an ac supplied load.

2. Discussion of the Related Art

In some cases, for example when a load is a motor connected to an ac supply, it is desired to provide a switch which, when controlled, either turns off the current to the load, allows current to flow in only one direction, or allows current to flow in only the opposite direction, so that the motor stops or rotates in one direction or the other.

In the prior art, such functions were realized by complex switch and logic circuits.

SUMMARY OF THE INVENTION

The present invention aims at achieving this function with a monolithic component whose control circuit is formed by a simple selection switch.

To achieve this object, the present invention provides a three-state switch designed to be inserted in an ac supply circuit that is associated with a state selection circuit to, in a first state, be open, in a second state, allow a current of a first polarity to flow, and in a third state, allow a current of a second polarity to flow. The switch includes a cathode gate thyristor and an anode gate thyristor connected head-to-tail, the gate of the cathode gate thyristor forming a control terminal and being connected through a resistor to the gate of the anode gate thyristor. The state selection circuit includes a selector having a first terminal connected to the control terminal and a second terminal which, in the first state, is directly connected to the cathode of the cathode gate thyristor, in the second state, is floating, and in the third state, is connected to a voltage lower, by a predetermined value, than the cathode voltage of the cathode gate thyristor.

According to an embodiment of the present invention, in the third state, the second terminal of the selector is connected to the cathode of the cathode gate thyristor through a voltage source having a value ranging between 6 to 20 volts.

According to an embodiment of the present invention, the resistor has a value higher than 10 KΩ.

In addition, the present invention provides a monolithic implementation of the above-mentioned three-state switch, wherein the two thyristors are vertical thyristors in a semiconductor substrate of a first conductivity type, the bottom surface of the substrate being connected to a metallization and corresponding to the anode of the cathode gate thyristor and to the cathode of the anode gate thyristor, a diffused low doping level region of a second conductivity type forming a resistor extending from the cathode gate layer of the cathode gate thyristor towards the anode of the anode gate thyristor and a metallization coating the end of the resistor at an upper surface of the substrate.

According to an embodiment of the present invention, beneath the metallization is formed a region of the second conductivity type with a high doping level in contact with the low doping level region which forms the resistor and a region of the first conductivity type with a high doping level in contact with the substrate.

BRIEF DESCRIPTION OF THE DRAWINGS

The foregoing and other objects, features, aspects and advantages of preferred, non-limiting, embodiments of the present invention will be described by way of example with reference to the accompanying drawings, in which:

FIG. 1 shows a load L connected across terminals A1 and A2 of an ac mains network. Load L is connected in series with a switch 10 controlled by a control circuit or selector 20. It is desired, depending upon whether the selector 20 provides one or another of three control signals, designated logically as states 0, 1 and −1, that switch 10 is off, or allows current to flow from terminal A1 towards terminal A2, or allows current to flow from terminal A2 towards terminal A1. Thus, for example, if load L is a dc motor, switch 10 will cause the motor to stop, or to rotate in a first direction, or to rotate in the second direction. One of the two terminals of the ac supply, for example terminal A2, may be grounded.

As shown in FIG. 2, according to an embodiment of the present invention, the three-state switch 10 is achieved by the head-to-tail connection of a cathode gate thyristor Th1 and an anode gate thyristor Th2. The anode of the cathode gate thyristor and the cathode of the anode gate thyristor are connected to load L. The cathode of the cathode gate thyristor and the anode of the anode gate thyristor are connected to terminal A2. The gate g1 of the cathode gate thyristor is connected to the gate g2 of the anode gate thyristor through a resistor Rg. Gate g1 forms the control terminal G of the switch. The control terminal G is connected to a first terminal of a selector S whose second terminal is movable between:

- a terminal "0" that is connected to the cathode of the cathode gate thyristor,
- a terminal "1" which is floating, and
- a terminal "−1" that is connected to a voltage more negative, by a determined value, than the cathode voltage of the cathode gate thyristor Th1. This can be achieved, for example, by placing a voltage source −E in series between terminal −1 and the cathode of thyristor Th1. The voltage source can be conventionally provided from the ac voltage by a conventional stepdown/rectifier circuit.

As will be apparent from the following description, depending upon whether selector S is at position 0, 1 or −1, either both thyristors Th1 and Th2 are off, or only thyristor Th1 is likely to switch on when voltage at terminal A1 is higher than voltage at terminal A2, or only thyristor Th2 is likely to switch on when voltage at terminal A2 is higher than voltage at terminal A1.

At state 0, selector S is connected to terminal 0, control terminal G is connected to the cathode of the cathode gate thyristor and to the anode of the anode gate thyristor. Since thyristor Th1 has its gate connected to its cathode, thyristor Th1 remains off. Thyristor Th2 is also off since its anode gate is connected to its anode. Thus, no gate current can flow in either of thyristors Th1, Th2.

Figure 1:
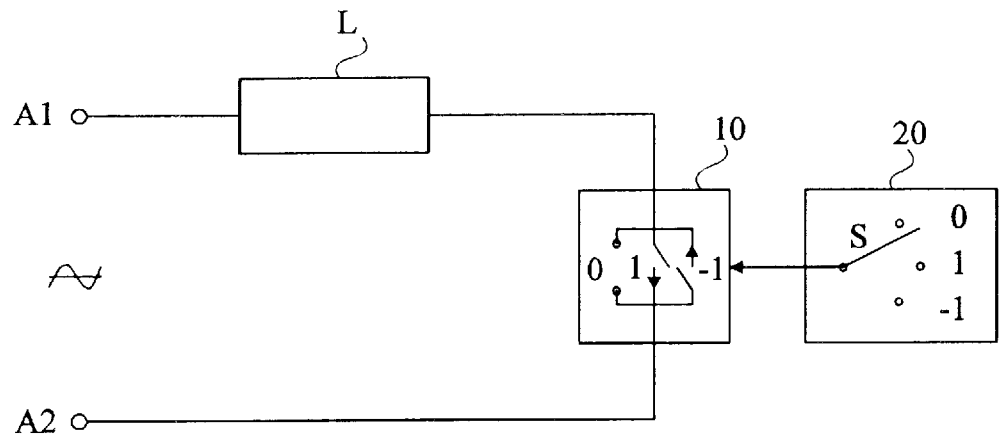
FIG. 1 is a functional block diagram of a three-state switch according to an embodiment of the present invention.
Figure 2:
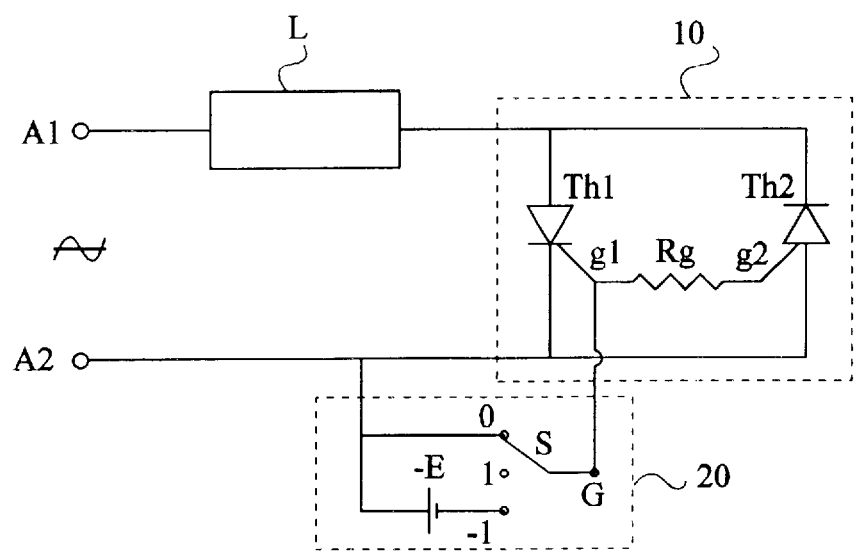
FIG. 2 schematically shows a three-state switch according to an embodiment of the present invention.
Figure 3:
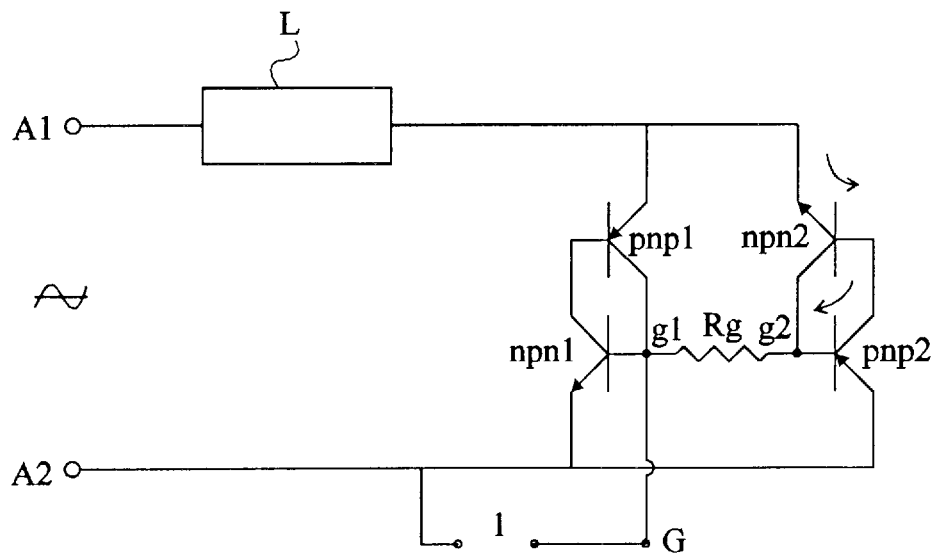
FIG. 3 illustrates a circuit equivalent to the circuit of FIG. 2 to explain the operation of the three-state switch in one of its three states.

To explain state 1, where control terminal G remains floating, reference will be made to the equivalent circuit of FIG. 3. In FIG. 3, each thyristor Th1 or Th2 is represented by an equivalent circuit including two transistors. The cathode gate thyristor Th1 is equivalent to the assembly of two transistors pnp1 and npn1. The emitter of transistor pnp1 corresponds to the anode of the thyristor Th1 and the emitter of transistor npn1 corresponds to the cathode of the thyristor Th1. The base of transistor pnp1 is connected to the collector of transistor npn1. The collector of transistor pnp1 is connected to the base of transistor npn1, this connection corresponding to the cathode gate g1 of thyristor Th1. The anode gate thyristor Th2 is equivalent to the assembly of two transistors npn2 and pnp2. The emitter of transistor npn2 corresponds to the cathode of thyristor Th2 and the emitter of transistor pnp2 corresponds to the anode of thyristor Th2. The base of transistor npn2 is connected to the collector of transistor pnp2. The collector of transistor npn2 is connected to the base of transistor pnp2, this connection corresponding to the anode gate g2 of thyristor Th2. Resistor Rg is connected between terminals g1 and g2.

It should be noted that, in the context of a conventional implementation of a thyristor, the central layer of the equivalent PNP transistors and the collector layer of the equivalent NPN transistors correspond to a thick low doped N-type region. As a consequence, the junctions of the equivalent NPN transistors and the collector-base junction of the equivalent NPN transistors have very high reverse breakover voltages, for example approximately 400 volts, i.e. higher than the ac voltage of the mains. In contrast, for the equivalent NPN transistors, the emitter-base junctions may breakover at relatively low reverse voltages, approximately some tens of volts.

Thus, in state 1, in which the control terminal G remains floating, when terminal A1 is positive with respect to terminal A2, as soon as the voltage difference is sufficient, the emitter-base junction of transistor npn2 is reverse biased. The collector-base junction of transistor pnp2 is forward biased. A current flows thus from A1 towards A2 through the reverse base-emitter junction of transistor npn2, the forward collector-base junction of transistor pnp2, resistor Rg and the base-emitter junction of transistor npn1, which is the gate junction of thyristor Th1. Since thyristor Th1 has a positive voltage at its anode and receives positive cathode gate current, thyristor Th1 turns on.

In contrast, at state 1, when terminal A2 is positive with respect to terminal A1, thyristor Th1 is off because it is reverse biased and thyristor Th2 cannot turn on. Indeed, any gate current flow in thyristor Th1 is blocked by at least one reverse junction having a high breakover voltage.

Finally, in state −1, where terminal G is connected to the cathode of the cathode gate thyristor Th1 and to the anode of the anode gate thyristor Th2 through a voltage source −E, the gate-cathode junction of thyristor Th1 is always reverse biased and the gate-anode junction of thyristor Th2 is always forward biased. Thus, when terminal A1 is positive with respect to terminal A2, thyristor Th1 cannot turn on whereas, when terminal A2 is more positive than terminal A1, thyristor Th2 is on.

In this state −1, when terminal A1 is positive with respect to terminal A2, even if thyristor Th1 is off, a leakage current flows from A1 toward A2 through the reverse emitter-base junction of transistor npn2, the forward base-emitter junction of transistor pnp2, resistor Rg and the voltage source −E. To limit the current, resistor Rg should have a high value, for example higher than 10 K$\Omega$. The value of Rg should be optimized to insure a sufficient anode gate current to turn on thyristor Th2 when A2 is positive with respect to A1. If thyristor Th2 is a sensitive thyristor requiring a gate current higher than 200 $\mu$A and if E=12 V, Rg should be lower than 60 K$\Omega$. Thus, a 30 K$\Omega$ value may be selected, for example. With such a value of resistance for Rg, the above-mentioned leakage current is negligible.

One thus obtains a three-state switch controlled by logic levels corresponding to the position of a selector to either block a current, allow the current to flow in one direction, or allow the current to flow in the opposite direction.

Selector S has been described above as a simple manual selector. However, it should be clear that the selector may be a remote-controlled electronic device or an electronic device using the control signals of an electronic control device such as a microcontroller.

Figure 4:
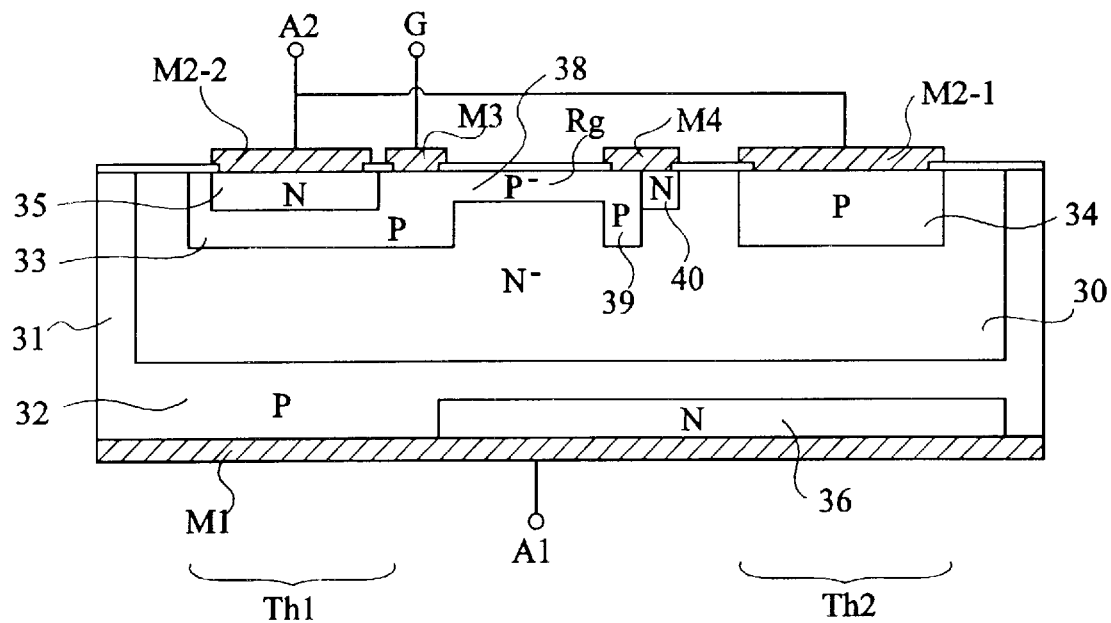
FIG. 4 shows an exemplary monolithic implementation of the three-state switch according to an embodiment of the present invention.

According to an embodiment of the present invention, the three-state switch may advantageously be a monolithic component. An exemplary monolithic implementation of such a component is illustrated in FIG. 4. In FIG. 4, the component is formed from a region 30 of an N-type substrate limited, for example, by P-type insulation walls 31. The bottom surface of the substrate includes a P-type region 32. The upper surface of the substrate includes P-type regions 33 and 34. Inside P-type region 33 is formed an N-type region 35. At the bottom surface and at least facing P-type region 34 is formed an N-type region 36. The bottom surface of the substrate is coated with a metallization M1. The P-type region 34 is coated with a metallization M2-1 and the upper surface of N-type region 35 is coated with a metallization M2-2. A portion of P-type region 33 in which is formed region 35 is coated with a metallization M3. Thus, PNPN regions 32-31-33-35 form thyristor Th1 whose region 33 forms the cathode gate layer integral with a metallization M3. PNPN regions 34-30-32-36 form the anode gate thyristor Th2. Substrate 30 corresponds to the anode gate region of thyristor Th2.

In addition, as shown in FIG. 4, resistor Rg is formed by a low doped P-type region 38 formed at the upper surface of the substrate. Region 38 extends from a portion of region 33 near the gate region of thyristor Th1 toward anode region 34 of thyristor Th2. A metallization M4 forms a connection between the other end of region 38 and the anode gate region of thyristor Th2. Preferably, metallization M4 is formed over an overdoped P-type region 39 contacting region 38 and over an overdosed N-type region 40 formed from the upper surface in substrate 30 to ensure an ohmic contact between the second terminal of the resistor and the anode gate region of thyristor Th2.

In operation, metallization M1 is connected to terminal A1, metallization M2-1/M2-2 is connected to terminal A2, metallization M3 is connected to terminal G, and metallization M4 is not connected.

Of course the present invention is amenable to various modifications and alterations, each considered to be within the scope of the present invention, with regard to both the circuit and its integration. In particular, those skilled in the art may use any known equivalent component for each element.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit designed to be inserted in an ac supply circuit, comprising:

a three-state switch including a cathode gate thyristor and an anode gate thyristor connected head-to-tail, a gate of the cathode gate thyristor forming a control terminal and being connected through a resistor to a gate of the anode gate thyristor, the switch being open in a first state, the switch allowing a current of a first polarity to flow in a second state, and the switch allowing a current of a second polarity to flow in a third state; and a state selection circuit including a selector having a first terminal and a second terminal, the first terminal of the selector being connected to the control terminal and the second terminal of the selector being directly connected to a cathode of the cathode gate thyristor when the switch is in the first state, being floating when the switch is in the second state, and being connected to a voltage lower, by a predetermined value, than a cathode voltage of the cathode gate thyristor when the switch is in the third state.

2. The circuit according to claim 1, wherein the second terminal of the selector is connected to the cathode of the cathode gate thyristor through a voltage source having a value ranging between 6 to 20 volts when the switch is in the third state.

3. The circuit according to claim 2, wherein the resistor has a value higher than 10 KΩ.

4. The circuit according to claim 1, wherein the switch is monolithically implemented in a semiconductor substrate of a first conductivity type, the cathode gate thyristor and the anode gate thyristor being vertical thyristors in the substrate, a bottom surface of the substrate being connected to a first metallization and corresponding to an anode of the cathode gate thyristor and to a cathode of the anode gate thyristor, a diffused low doping level region of the second conductivity type forming the resistor extending from a cathode gate layer of the cathode gate thyristor towards an anode of the anode gate thyristor, and a second metallization coating an end of the resistor at an upper surface of the substrate.

5. The circuit according to claim 4, wherein beneath the second metallization of the switch is formed a region of the second conductivity type with a high doping level in contact with the low doping level region which forms the resistor, and a region of the first conductivity type with a high doping level in contact with the substrate.

6. A three-state switch comprising:

a first switch terminal;

a second switch terminal;

a third switch terminal having a first state, a second state, and a third state;

a first unidirectional switching component having a first terminal coupled to the first switch terminal, a second terminal coupled to the second switch terminal, and a control terminal coupled to the third switch terminal, the first switching component conducting current from the first switch terminal to the second switch terminal when the third switch terminal has the first state; and a second unidirectional switching component having a first terminal coupled to the second switch terminal, a second terminal coupled to the first switch terminal, and a control terminal coupled to the third switch terminal, the second switching component conducting current from the second switch terminal to the first switch terminal when the third switch terminal has the second state;

wherein neither of the first and second switching components conduct current when the third switch terminal has the third state.

7. The three-state switch of claim 6, further comprising:

a reference voltage terminal to provide a voltage lower than a voltage at the second terminal; and a selector having a first terminal and a second terminal, the first terminal of the selector being coupled to the third switch terminal, and the second terminal of the selector being floating when the third switch terminal has the first state, being coupled to the reference voltage terminal when the third switch terminal has the second state, and being coupled to the second switch terminal when the third switch terminal has the third state.

8. The three-state switch of claim 7, wherein the voltage provided by the reference voltage terminal is approximately 6 to 20 volts lower than the voltage at the second terminal.

9. The three-state switch of claim 6, further comprising:

a resistor coupling the control terminal of the second switching component to the third switch terminal.

10. The three-state switch of claim 9, wherein:

the first unidirectional switching component includes a cathode gate thyristor having an anode that is coupled to the first switch terminal, a cathode that is coupled to the second switch terminal, and a gate that is coupled to the third switch terminal; and the second unidirectional switching component includes an anode gate thyristor having an anode that is coupled to the second switch terminal, a cathode that is coupled to the first switch terminal, and a gate that is coupled to the third switch terminal through the resistor.

11. The three-state switch of claim 10, wherein the resistor has a resistance lower than 60 KΩ.

12. The three-state switch of claim 10, further comprising:

a reference voltage terminal to provide a voltage lower than a voltage at the second terminal; and a selector having a first terminal and a second terminal, the first terminal of the selector being coupled to the third switch terminal, and the second terminal of the selector being floating when the third switch terminal has the first state, being coupled to the reference voltage terminal when the third switch terminal has the second state, and being coupled to the second switch terminal when the third switch terminal has the third state.

13. The three-state switch of claim 10, wherein the cathode gate thyristor, the anode gate thyristor, and the resistor are monolithically integrated in an integrated circuit that includes:

a semiconductor substrate of a first conductivity type having an upper surface and a lower surface;

a layer of a second conductivity type, opposite the first conductivity type, formed along the lower surface of the substrate;

first and second regions of the second conductivity type formed in the upper surface of the substrate;

a third region of the first conductivity type formed inside the first region;

a fourth region, formed along a portion of the lower surface of the substrate and inside the layer of the second conductivity type, the portion facing the second region; and a fifth region of the second conductivity type formed in the upper surface of the substrate, contacting the first region and separating, along with a portion of the substrate, the first region from the second region, the fifth region having a lower doping of the second conductivity type than the first region.

14. The three-state switch of claim 13, wherein the integrated circuit further includes:

a sixth region of the second conductivity type formed in the upper surface of the substrate and contacting an end of the fifth region that is not contacting the first region, the sixth region having a higher doping of the second conductivity type than the fifth region; and a seventh region of the first conductivity type formed in the upper surface of the substrate and contacting an end of the sixth region that is not contacting the fifth region, the seventh region having a higher doping of the first conductivity type than the substrate.

15. A three-state switch, comprising:

a first terminal;

a second terminal;

first means, coupled between the first and second terminals, for conducting current in a first direction;

second means, coupled between the first and second switch terminals, for conducting current in a second direction, the second direction being opposite to the first direction; and control means, coupled to the first and second means, for controlling conduction of current between the first and second terminals to be one of in the first direction only, in the second direction only, or not at all;

wherein the control means includes:
   a reference voltage terminal to provide a voltage lower than a voltage at the second terminal; and
   a selector having a first terminal and a second terminal, the first terminal of the selector being coupled to the first means and the second means, and the second terminal of the selector being floating to control conduction in the first direction only, being coupled to the reference voltage terminal to control conduction in the second direction only, and being coupled to the second terminal of the three-state switch to prevent conduction between the first and second terminals of the three-state switch.

16. A method of controlling current flow through a three-state switch, comprising the steps of:

allowing current to flow from a first terminal of the switch to a second terminal of the switch when a voltage at the first terminal is higher than a voltage at the second terminal and the switch has a first state;

allowing current to flow from the second terminal to the first terminal when the voltage at the second terminal is higher than the voltage at the first terminal and the switch has a second state;

preventing current from flowing between the first and second terminals when the switch has a third state; and limiting current flowing from the first terminal to the second terminal to a negligible value when the voltage at the first terminal is higher than the voltage at the second terminal and the switch has the second state;

wherein the switch includes a control terminal and the step of allowing current to flow from the second terminal to the first terminal includes a step of connecting the control terminal to a voltage that is more negative than the voltage at the second terminal.

17. A method of controlling current flow through a three-state switch, comprising the steps of:

allowing current to flow from a first terminal of the switch to a second terminal of the switch when a voltage at the first terminal is higher than a voltage at the second terminal and the switch has a first state;

allowing current to flow from the second terminal to the first terminal when the voltage at the second terminal is higher than the voltage at the first terminal and the switch has a second state;

preventing current from flowing between the first and second terminals when the switch has a third state; and limiting current flowing from the first terminal to the second terminal to a negligible value when the voltage at the first terminal is higher than the voltage at the second terminal and the switch has the second state;

wherein the step of allowing current to flow from the first terminal to the second terminal is performed by a first thyristor, and the step of allowing current to flow from the second terminal to the first terminal is performed by a second thyristor, the method further comprising a step of:
   generating, in the second thyristor, a gate current to provide to the first thyristor when the voltage at the first terminal is higher than the voltage at the second terminal and the switch has the first state.

18. A three-state switch, comprising:

a first terminal;

a second terminal;

first means, coupled between the first and second terminals, for conducting current in a first direction;

second means, coupled between the first and second switch terminals, for conducting current in a second direction, the second direction being opposite to the first direction; and control means, coupled to the first and second means, for controlling conduction of current between the first and second terminals to be one of in the first direction only, in the second direction only, or not at all;

wherein:
   the first means includes a three-terminal cathode gate thyristor having an anode that is coupled to the first terminal, a cathode that is coupled to the second terminal, and a gate that is coupled to the control means; and
   the second means includes a three-terminal anode gate thyristor having an anode that is coupled to the second terminal, a cathode that is coupled to the first terminal, and a gate that is coupled to the control means.

19. The three state switch of claim 18, further comprising:

means, coupling the gate of the cathode gate thyristor to the gate of the anode gate thyristor, for providing a gate current to the cathode gate thyristor to initiate conducting current in the first direction.

20. The three state switch of claim 19, wherein the means for providing includes means for limiting leakage current to a negligible value when the control means controls conduction to be in the second direction only.

* * * * *